(12) United States Patent
Liu et al.

(10) Patent No.: US 7,552,759 B2
(45) Date of Patent: Jun. 30, 2009

(54) LOOP-TYPE HEAT EXCHANGE DEVICE

(75) Inventors: Tay-Jian Liu, Guangdong (CN);
Chao-Nien Tung, Guangdong (CN);
Chih-Peng Lee, Guangdong (CN);
Chuen-Shu Hou, Guangdong (CN);
Chih-Hao Yang, Guangdong (CN)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 426 days.

(21) Appl. No.: 11/306,421

(22) Filed: Dec. 28, 2005

(65) Prior Publication Data
US 2006/0283577 A1    Dec. 21, 2006

(30) Foreign Application Priority Data
Jun. 17, 2005    (CN)    ............ 2005 1 0035419

(51) Int. Cl.
*F28D 15/00*    (2006.01)
(52) U.S. Cl. ............ 165/104.26; 165/104.33; 361/704; 126/635
(58) Field of Classification Search ............ 62/129; 126/635; 257/715
See application file for complete search history.

(56) References Cited

U.S. PATENT DOCUMENTS

| | | | | |
|---|---|---|---|---|
| 5,095,404 | A * | 3/1992 | Chao ............ | 361/700 |
| 6,410,982 | B1 * | 6/2002 | Brownell et al. ............ | 257/714 |
| 6,418,017 | B1 * | 7/2002 | Patel et al. ............ | 361/700 |
| 6,466,442 | B2 * | 10/2002 | Lin ............ | 361/695 |
| 6,474,074 | B2 * | 11/2002 | Ghoshal ............ | 62/3.7 |
| 6,536,510 | B2 * | 3/2003 | Khrustalev et al. ...... | 165/104.33 |
| 6,608,752 | B2 * | 8/2003 | Morris et al. ............ | 361/700 |
| 6,901,994 | B1 * | 6/2005 | Jin-Cherng et al. ..... | 165/104.26 |
| 7,246,655 | B2 * | 7/2007 | Mochizuki et al. ..... | 165/104.26 |
| 2003/0000689 | A1 * | 1/2003 | Kuo et al. ............ | 165/185 |
| 2003/0051857 | A1 * | 3/2003 | Cluzet et al. ............ | 165/41 |
| 2005/0077030 | A1 | 4/2005 | Wong | |

FOREIGN PATENT DOCUMENTS

| | | | |
|---|---|---|---|
| JP | 60259861 A | * | 12/1985 |
| JP | 2001255085 A | * | 9/2001 |
| JP | 2004251522 A | * | 9/2004 |
| KR | 19970051923 | * | 10/1997 |
| TW | 580128 | | 3/2004 |
| TW | 200513624 | | 4/2005 |

* cited by examiner

*Primary Examiner*—Cheryl J Tyler
*Assistant Examiner*—Joseph Corrigan
(74) *Attorney, Agent, or Firm*—Winston Hsu

(57) ABSTRACT

A loop-type heat exchange device (10) is disclosed, which includes an evaporator (20), a condenser (40), a vapor conduit (30) and a liquid conduit (50). The evaporator contains therein a working fluid. The working fluid in the evaporator evaporates into vapor after absorbing heat, and the generated vapor flows, via the vapor conduit, to the condenser where the vapor releases its latent heat of evaporation and is condensed into condensate. The condensate then returns back, via the liquid conduit, to the evaporator to thereby form a heat transfer loop. The condenser defines therein a chamber, and a plurality of heat-exchange pins is provided inside the chamber for effectively exchanging heat with the vapor entering into the condenser.

22 Claims, 10 Drawing Sheets

LOOP-TYPE HEAT EXCHANGE DEVICE

FIELD OF THE INVENTION

The present invention relates generally to an apparatus for transfer or dissipation of heat from heat-generating components, and more particularly to a loop-type heat exchange device suitable for removing heat from electronic components.

DESCRIPTION OF RELATED ART

As progress continues to be made in electronic industries, electronic components such as integrated circuit chips are produced to have more powerful functions while maintaining a unchanged size or even a smaller size. As a result, the amount of heat generated by these electronic components during their normal operations is commensurately increased, which in turn will adversely affect their workability and stability. It is well known that cooling devices are commonly used to remove heat from heat-generating components. However, currently well-known cooling devices such as heat sink plus cooling fan are no longer qualified or desirable for removing the heat from these electronic components due to their low heat removal capacity. Conventionally, increasing the rotation speed of the cooling fan and increasing the size of the heat sink are two approaches commonly used to improve the heat dissipating performance of the cooling device involved. However, if the rotation speed of the cooling fan is increased, problems such as large noise will inevitably be raised. On the other hand, by increasing the size of the heat sink, it will make the cooling device bulky, which contravenes the current trend towards miniaturization.

Currently, an advantageous mechanism for more effectively removing the heat from these electronic components and overcoming the aforementioned disadvantages is adopted, which is related to use of heat pipe technology. Heat pipes are an effective heat transfer means due to their low thermal resistance. A heat pipe is usually a vacuum casing containing therein a working fluid. Preferably, a wick structure is provided inside the heat pipe, lining an inner wall of the casing. The heat pipe has an evaporating section for receiving heat from a heat-generating component and a condensing section for releasing the heat absorbed by the evaporating section. When the heat is inputted into the heat pipe via its evaporating section, the working fluid contained therein absorbs the heat and turns into vapor. Due to the difference of vapor pressure between the two sections of the heat pipe, the generated vapor moves, with the heat being carried, towards the condensing section where the vapor is condensed into condensate after releasing the heat into ambient environment by, for example, fins thermally contacting the condensing section. Due to the difference of capillary pressure developed by the wick structure between the two sections, the condensate is then drawn back by the wick structure to the evaporating section where it is again available for evaporation.

In the heat pipe, however, there still exists a fatal drawback awaited to be overcome. The movement of the vapor is countercurrent to that of the condensate within the casing of the heat pipe. The movement of the vapor will, to a certain extent, produce a resistance to the flow of the condensate due to an interaction between the vapor and the condensate. This negative effect will lower down the speed of the condensate in supplying to the evaporating section of the heat pipe. If the condensate is not timely sent back to the evaporating section, the heat pipe will suffer a dry-out problem at that section.

In order to overcome the drawback of the conventional heat pipe, a loop-type heat exchange device has been proposed. The loop-type heat exchange device includes an evaporator, a condenser, a vapor conduit and a liquid conduit. The evaporator defines therein a chamber for containing a working fluid. The vapor and liquid conduits each are connected between the evaporator and the condenser. Specifically, the working fluid in the evaporator evaporates into vapor after absorbing the heat from the heat-generating component, and the generated vapor then flows, via the vapor conduit, to the condenser where the vapor is condensed into condensate after releasing its latent heat of evaporation. The condensate then returns back to the evaporator via the liquid conduit to thereby be available again for evaporation, thus forming a heat transfer loop. One of the advantages of the loop-type heat exchange device in relation to the conventional heat pipe is that the vapor and the condensate move separately and do not interfere with each other.

In practice, the condenser of the loop-type heat exchange device generally takes the form of a plurality of fins stacked along a pipe section interconnecting the vapor conduit or the liquid conduit, or similar to that. In this situation, the heat carried by the vapor is conducted to the fins via a circumferential periphery of the involved pipe section. However, the pipe section generally has a very limited circumferential surface area to contact with the fins and as a result, the interfacial resistance and the spreading resistance between the involved pipe section and the fins are relatively high. As a result, the heat carried in the vapor cannot be effectively released since the vapor generally runs quickly in the heat transfer loop.

As an alternative, the condenser has been designed to include a hollow casing defining therein a chamber, and a plurality of fins attached to an outer surface of the casing. In this case, the generated vapor is firstly guided to the chamber of the casing, in which the heat carried by the vapor is conducted through the walls of the casing to the fins outside the chamber for dissipation. However, in this design, no effective mechanism is provided to ensure the condensate resulting from the vapor to return back to the evaporator rapidly and efficiently. It is therefore easy to lead to the fact that a large amount of the condensate accumulates in the chamber of the condenser, and thus results in a dry-out problem at the evaporator as the condensate is not timely sent back thereto.

Therefore, it is desirable to provide a loop-type heat exchange device which overcomes the foregoing disadvantages.

SUMMARY OF INVENTION

The present invention relates to a loop-type heat exchange device for removing heat from a heat-generating component. The heat exchange device includes an evaporator, a condenser, a vapor conduit and a liquid conduit. The heat exchange device contains therein a working fluid. The working fluid is capable of turning into vapor in the evaporator upon receiving the heat from the heat-generating component. The condenser defines therein a chamber. Each of the vapor and liquid conduits is connected between the evaporator and the condenser. The vapor generated in the evaporator is capable of being transferred via the vapor conduit to the condenser and turning into condensate in the condenser upon releasing the heat carried by the vapor. The condensate is capable of being transferred via the liquid conduit to the evaporator. The heat exchange device further includes means provided inside the chamber of the condenser for exchanging heat with the vapor transferred to the condenser.

Said means for exchanging heat with the vapor may be a plurality of heat-exchange pins extending in the chamber of the condenser. These heat-exchange pins function as a cooling-enhancing structure to enhance the heat exchange capability of the condenser. In one embodiment of the present heat exchange device, said means is a plurality of metal pin-fins. In an alternative embodiment, said means is a plurality of miniaturized heat-pipes. Thus, the condenser has a high heat-absorbing surface area due to the presence of these heat-exchange pins and accordingly the vapor entering into the condenser is capable of being effectively heat-exchanged with these heat-exchange pins.

As a further improvement, first and second wick structures are arranged inside the liquid conduit and the condenser respectively. The second wick structure connects with the first wick structure. Thus, the condensate in the condenser resulting from the vapor is capable of being timely sent back to the evaporator in a continuous manner under the capillary forces developed by the first and second wick structures, thereby preventing an excessive amount of the condensate from accumulating in the condenser and accordingly avoiding the potential dry-out problem occurring at the evaporator.

Other advantages and novel features of the present invention will become more apparent from the following detailed description of preferred embodiment when taken in conjunction with the accompanying drawings, in which:

DETAILED DESCRIPTION

Figure 1:
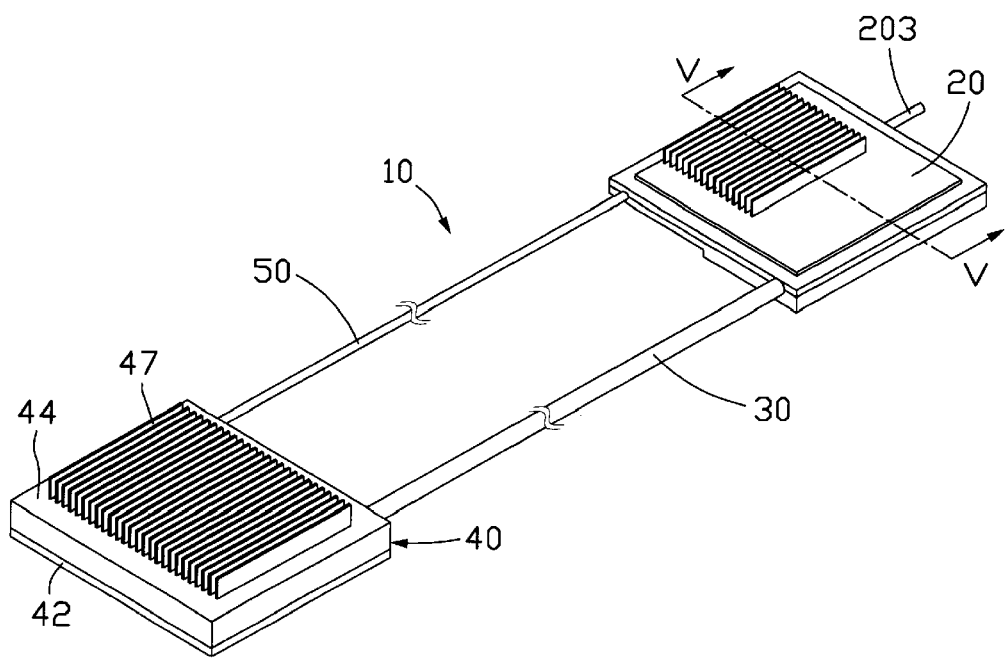
FIG. 1 is an isometric view of a loop-type heat exchange device in accordance with a first embodiment of the present invention.

FIG. 1 illustrates a loop-type heat exchange device 10 in accordance with a first embodiment of the present invention. The heat exchange device 10 includes an evaporator 20, a vapor conduit 30, a condenser 40 and a liquid conduit 50. The evaporator 20 preferably is made of two separable portions connected together, as will be discussed in more detail later. The vapor and liquid conduits 30, 50 lie in parallel to each other, although they are not limited to this relationship. Two ends of each of the vapor and liquid conduits 30, 50 are respectively connected to the evaporator 20 and the condenser 40. The vapor and liquid conduits 30, 50 preferably are made of flexible metal or non-metal materials so that they could be bent or flattened easily in order to cause the heat exchange device 10 to be applicable in electronic products having a limited mounting space such as notebook computers.

The heat exchange device 10 contains therein a working fluid (not shown). As heat from a heat source (not shown) is applied to the evaporator 20, the working fluid contained in the evaporator 20 evaporates into vapor after absorbing the heat. Then, the generated vapor flows, via the vapor conduit 30, to the condenser 40 where the vapor releases its latent heat of evaporation and is condensed into condensate. The condensate then returns back from the condenser 40, via the liquid conduit 50, to the evaporator 20 where it is again available for evaporation, thus forming a heat transfer loop. Thus, the movements of the vapor and the condensate are carried out respectively and separately in the vapor conduit 30 and the liquid conduit 50. The vapor conduit 30 is preferred to have a larger diameter than the liquid conduit 50 so as to enable the generated vapor to move towards the condenser 40 effectively and smoothly.

Figure 2:
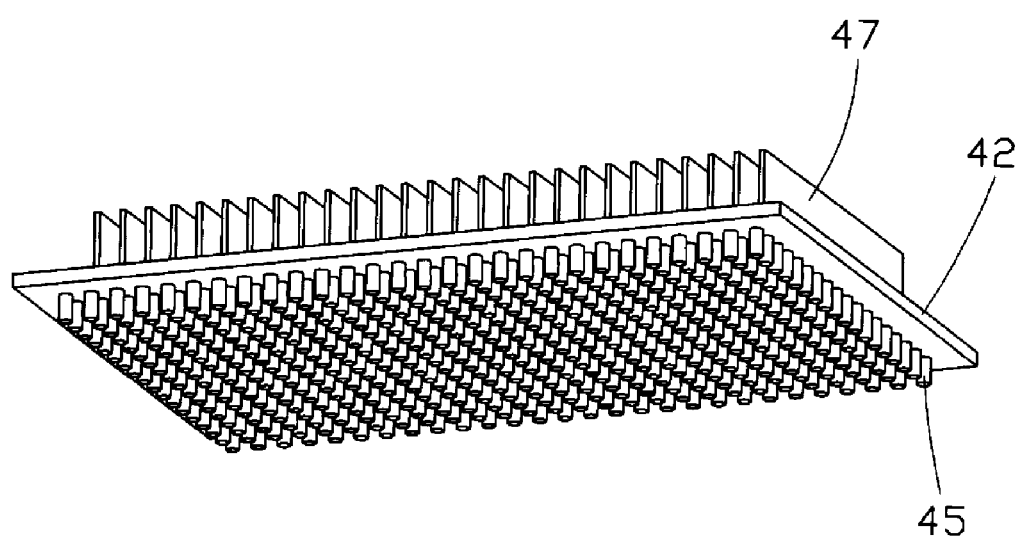
FIG. 2 is an isometric view of a bottom plate of a condenser of the loop-type heat exchange device of FIG. 1 in an upside-down manner.
Figure 3:
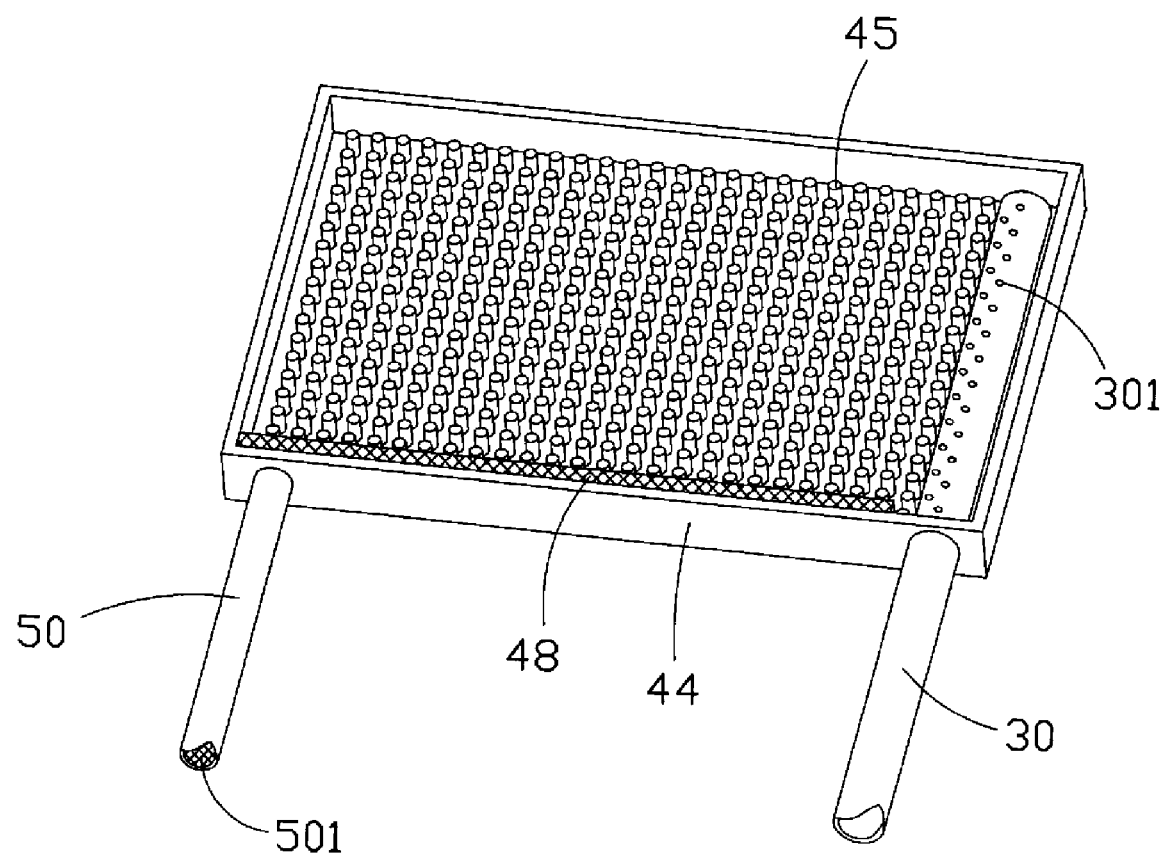
FIG. 3 is an isometric view of a top cover of the condenser of the loop-type heat exchange device of FIG. 1 in an upside-down manner.
Figure 4:
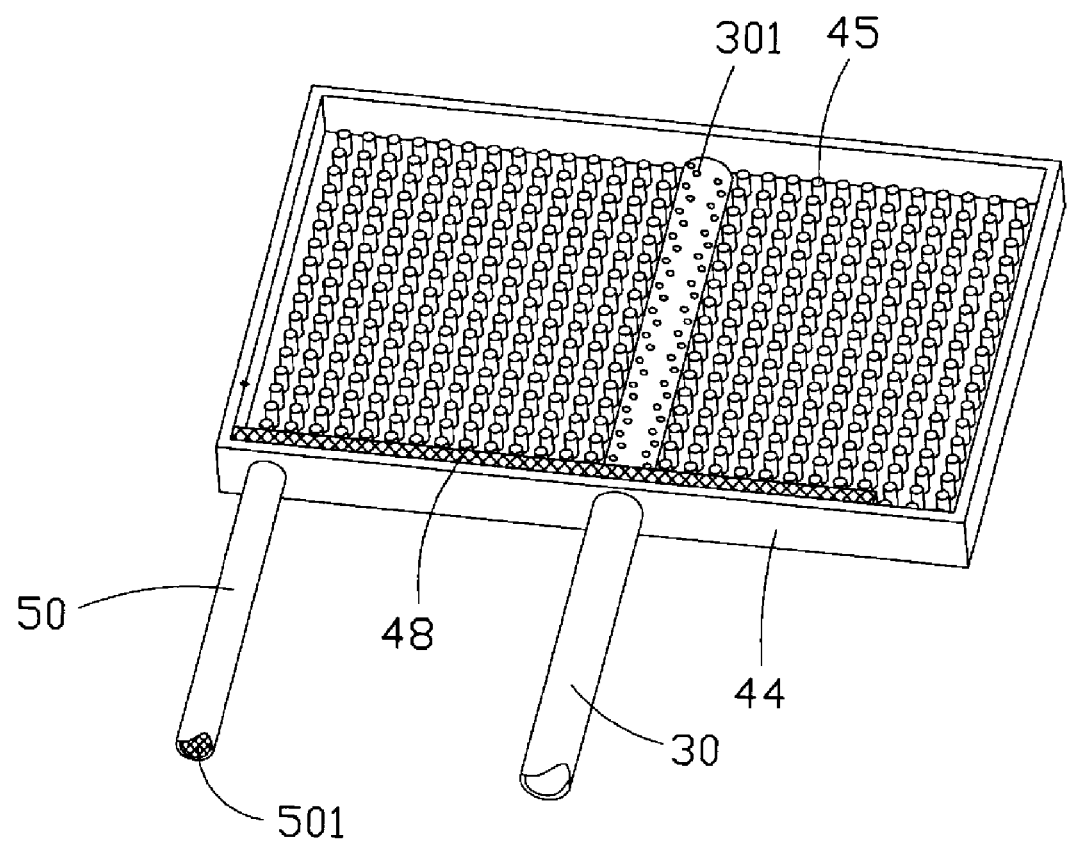
FIG. 4 is a view similar to FIG. 3, showing the top cover of the condenser in accordance with another embodiment.

With reference also to FIGS. 2-4, the condenser 40 is a two-piece structure, which includes a bottom plate 42 and a top cover 44. The bottom plate 42 and the top cover 44 cooperate with each other to define a chamber (not labeled) inside the condenser 40. A plurality of plate-type cooling fins 47 extends from an outer surface of each of the bottom plate 42 and the top cover 44 for increasing the heat-dissipation surface area of the condenser 40. In addition, a plurality of heat-exchange pins 45 extends from an inner surface of each of the bottom plate 42 and the top cover 44 towards the chamber of the condenser 40 so as to increase the heat-absorbing surface area of the condenser 40 and exchange heat more efficiently with the vapor guided into the condenser 40. These heat-exchange pins 45 may be metal pin-fins or miniaturized heat-pipes. For obtaining a thinner size for the condenser 40, the heat-exchange pins 45 may be integrally formed with the bottom plate 42 and/or the top cover 44. The heat-exchange pins 45 formed inside the condenser 40 function as a cooling-enhancing structure to enhance the heat exchange capability of the condenser 40 to cool the vapor. To this purpose, these heat-exchange pins 45 may also be substituted with a plurality of plate-type metal fins. Specifically, the vapor entering into the condenser 40 is directly and rapidly heat-exchanged with these heat-exchange pins 45. The heat-exchange pins 45 then transfer the heat received from the vapor to the outer cooling fins 47 for further dissipation.

In order to bring the condensate resulting from the vapor back to the evaporator 20 timely, a first wick structure 501 is arranged against an inner surface of the liquid conduit 50 for drawing the condensate back under a capillary force generated by the first wick structure 501, as particularly shown in FIGS. 3-4. The first wick structure 501 may be fine grooves integrally formed at the inner surface of the liquid conduit 50, screen mesh or bundles of fiber inserted into the liquid conduit 50, or sintered powder combined to the inner surface of the liquid conduit 50 by a sintering process. In addition to the first wick structure 501 provided in the liquid conduit 50, a second wick structure 48 is provided inside the condenser 40, lining a sidewall thereof to which the vapor and liquid conduits 30, 50 are commonly connected, as shown in FIGS. 3-4. This second wick structure 48 preferably is in the form of sintered powder or a screen mesh made of metal wires or organic fibers woven together. This second wick structure 48 covers an inlet (not labeled) of the liquid conduit 50 and therefore connects with the first wick structure 501 of the liquid conduit 50. After the vapor entering into the condenser 40 releases its latent heat and turns into the condensate, the condensate is firstly absorbed by the second wick structure 48 due to its capillary force, and then is further brought back the evaporator 20 by the first wick structure 501 under the capillary force thereof. Thus, the condensate in the condenser 40 is capable of being timely sent back to the evaporator 20 in a continuous manner, thereby preventing an excessive amount of the condensate from accumulating in the condenser 40 and accordingly avoiding the potential dry-out problem occurring at the evaporator 20.

As particularly shown in FIGS. 3-4, a distal end portion of the vapor conduit 30 extends deep into an interior of the condenser 40, and a plurality of openings 301 is defined in that distal end portion. These openings 301 are distributed over a circumferential periphery of the distal end portion and function as a dispenser for distributing the vapor guided by the vapor conduit 30 evenly towards the heat-exchange pins 45 of the condenser 40. As shown in FIG. 3, the vapor conduit 30 is inserted into the condenser 40 from one side thereof, and the openings 301 are oriented towards an opposite side of the condenser 40. As shown in FIG. 4, the vapor conduit 30 is inserted into the condenser 40 from a middle thereof, and the openings 301 are distributed over two opposite sides of the distal end portion of the vapor conduit 30 facing respectively two groups of the heat-exchange pins 45 divided by the vapor conduit 30.

Figure 5:
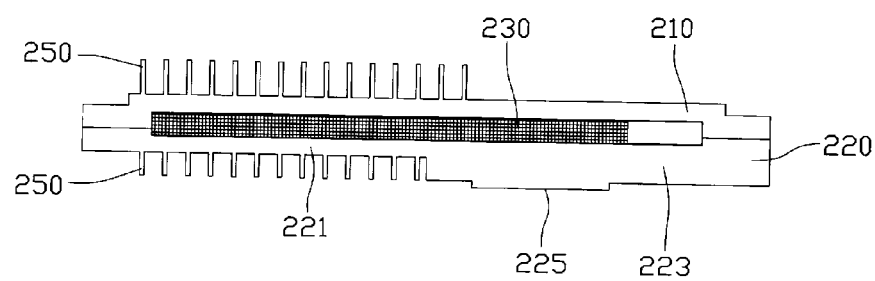
FIG. 5 is a cross-sectional view of an evaporator of the loop-type heat exchange device of FIG. 1, taken along line V-V thereof.
Figure 6:
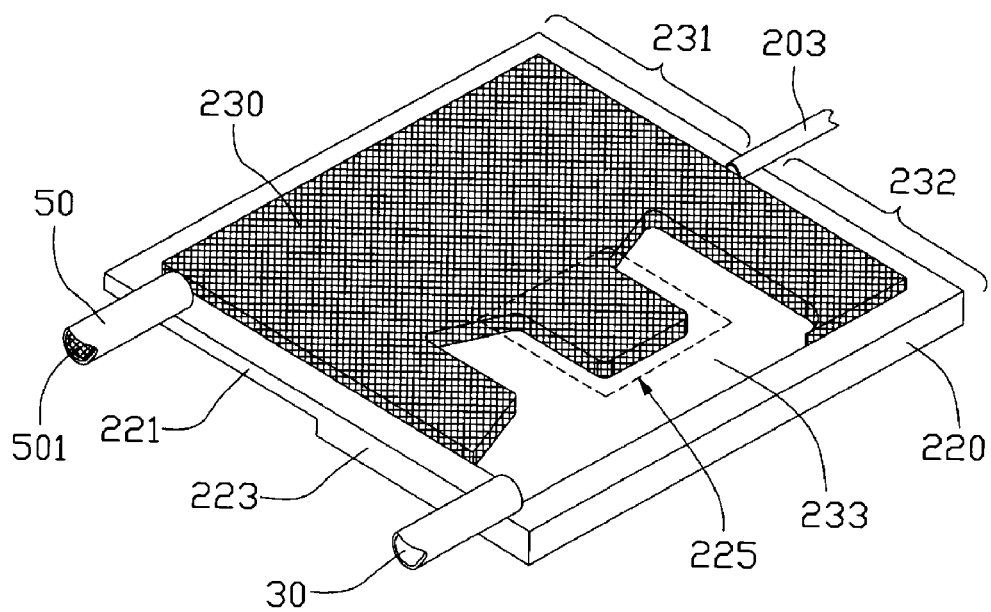
FIG. 6 is an isometric view of the evaporator of the loop-type heat exchange device of FIG. 1, with a top cover thereof being removed.
Figure 7:
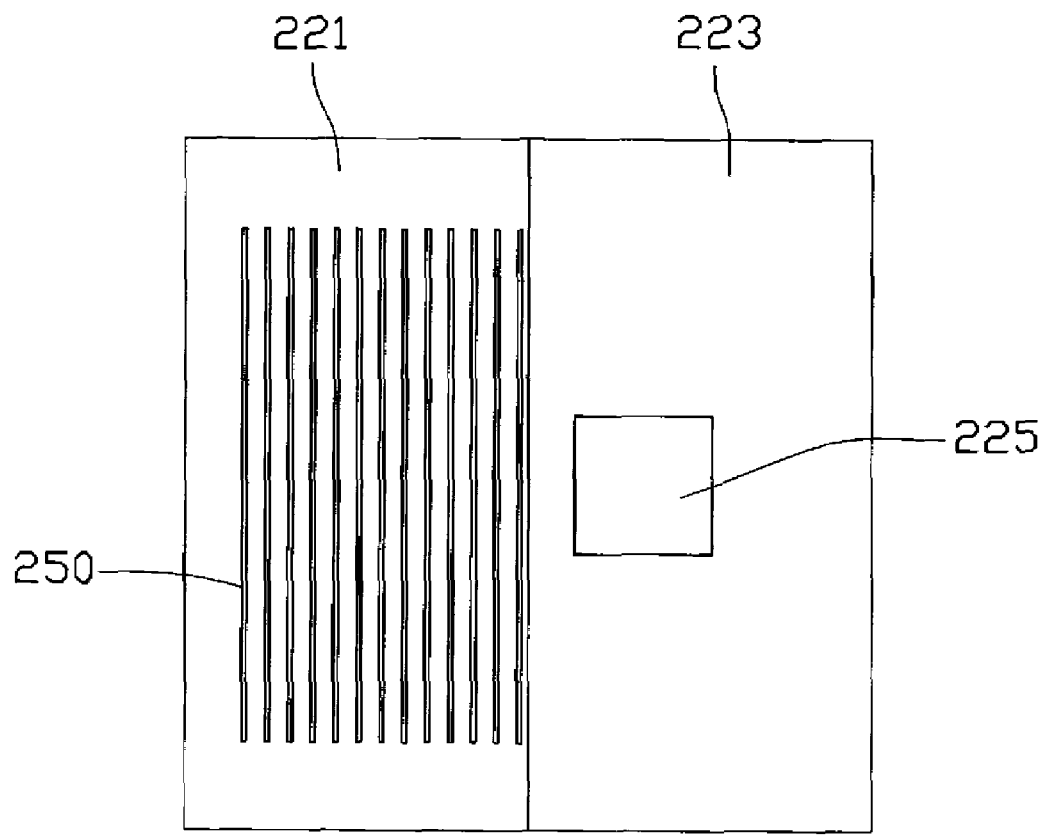
FIG. 7 is a bottom plan view of the evaporator of the loop-type heat exchange device of FIG. 1.

With reference to FIGS. 5-7, the evaporator 20 of the present heat exchange device 10 has a plate-type configuration, which includes a top cover 210 and a bottom cover 220. The top and bottom covers 210, 220 cooperate with each other to define a chamber (not labeled) inside the evaporator 20. The bottom cover 220 includes a first, thinner section 221 and a second, thicker section 223 extending from the first section 221. A protrusion 225 is formed outwardly from a middle portion of the second section 223 of the bottom cover 220 for contacting the heat source, as shown in FIGS. 5 and 7. A third wick structure 230 is arranged inside the evaporator 20. The third wick structure 230 defines therein a plurality of micro-channels (not labeled) for storage of and providing passageways for the working fluid contained in the evaporator 20. The third wick structure 230 is preferably in the form of sintered powder or a screen mesh made of metal wires or organic fibers. The working fluid contained in the evaporator 20 is saturated in the third wick structure 230. The working fluid is injected into the evaporator 20 via a small tube 203 inserted into the evaporator 20, as shown in FIG. 6. The working fluid is usually selected from liquids such as water or alcohol. Then, the evaporator 20 is vacuumed and the tube 203 is sealed.

Corresponding to the first and second sections 221, 223 of the bottom cover 220 of the evaporator 20, an interior of the chamber of the evaporator 20 is divided into two regions, i.e., a liquid micro-channel region 231 and an adjacent evaporating region 232. The micro-channel region 231 is fully filled with the third wick structure 230. A portion of the third wick structure 230 extends from the micro-channel region 231 into a middle part of the evaporating region 232. This portion of the third wick structure 230 has a size substantially equal to that of the protrusion 225 of the bottom cover 220, and is fittingly located just above the protrusion 225. Additionally, another portion of the third wick structure 230 also extends from the micro-channel region 231 into front and rear sides of the evaporating region 232, as viewed from FIG. 6. As a result, the third wick structure 230 spans across both the micro-channel region 231 and the evaporating region 232 of the chamber of the evaporator 20. The vapor and liquid conduits 30, 50 are connected to the evaporating region 232 and the micro-channel region 231, respectively. The remaining part of the evaporating region 232 not filled with the third wick structure 230 functions as a vapor-gathering section 233 for accommodating the generated vapor. The vapor-gathering section 233 is communicated with the vapor conduit 30 so as to enable the generated vapor to leave the evaporator 20 and go into the vapor conduit 30. Additionally, corresponding to the micro-channel region 231, each of the top and bottom covers 210, 220 of the evaporator 20 has a plurality of metal fins 250 extending from an outer surface thereof, as shown in FIG. 5.

In operation, the protrusion 225 of the evaporator 20 is maintained into thermal contact with the heat source. Preferably, a layer of thermal interface material is applied over their contacting surfaces in order to reduce thermal resistance. The heat generated by the heat source is firstly transferred to the second section 223 of the bottom cover 220 and then to the evaporating region 232 of the chamber of the evaporator 20 to cause the working fluid contained in that region to evaporate into the vapor after absorbing the heat from the heat source. Due to the difference of vapor pressure between the evaporator 20 and the condenser 40, the generated vapor accordingly moves towards the condenser 40 via the vapor conduit 30. After the vapor releases its latent heat in the condenser 40 and turns into the condensate, the condensate is then rapidly drawn back to the micro-channel region 231 of the chamber of the evaporator 20 via the liquid conduit 50 due to the capillary forces of the first and second wick structures 501, 48. Since an inventory of working fluid in the evaporating region 232 is reduced due to the evaporation in that region, the condensate returned to the micro-channel region 231 is subsequently drawn to the evaporating region 232 for being available again for evaporation as a result of the capillary force developed by the third wick structure 230, thus forming the heat transfer loop for continuously and effectively taking heat away from the heat source.

In order to ensure that the condensate temporarily stored in the micro-channel region 231 is timely supplied to the evaporating region 232, it is preferred to prevent the condensate from being directly heated and evaporated into vapor in the micro-channel region 231 since the thus generated vapor in that region will produce resistance to the flow of the condensate towards the evaporating region 232. In the present heat exchange device 10, the heat coming from the heat source is directly transferred to the second section 223 of the bottom cover 220. The two-section design of the bottom cover 220 is aimed to reduce an amount of the heat from the heat source to be conducted from the second section 223 to the first section 221 and finally to the micro-channel region 231 of the evaporator 20. Since the second section 223 has a larger thickness than the first section 221, the heat conducted laterally from the second section 223 towards the first section 221 is thus capable of being effectively reduced. As a result, the heat transferred from the first section 221 of the bottom cover 220 to the micro-channel region 231 of the evaporator 20 is also effectively reduced, and excessive vapor is thus prevented from being formed and accumulated in that region.

Since the micro-channel region 231 is connected with the adjacent evaporating region 232, a portion of the vapor generated in the evaporating region 232 will "creep" from the evaporating region 232 into the micro-channel region 231 due to a large vapor pressure in the vapor-gathering section 233. That is, a specific amount of the vapor generated in the evaporating region 232 will gradually move towards and enter into the micro-channel region 231 due to the large vapor pressure. In addition, the temperature in the micro-channel region 231 will also gradually increase, subject to a relatively high temperature and a flow of the vapor in the evaporating region 232. Thus, in order to reduce the vapor to be brought to and accumulated in the micro-channel region 231 to a minimum amount, it is also preferred to lower the temperature in the micro-channel region 231. In the present heat exchange device 10, the metal fins 250 formed on the top and bottom covers 210, 220 of the evaporator 20 corresponding to the micro-channel region 231 are applied to directly condense that portion of vapor having crept into the micro-channel region 231 into condensate at that region and on the other hand to maintain a relatively low temperature for the micro-channel region 231. In practice, the metal fins 250 may be substituted with other cooling devices such as cooling fans or thermoelectric cooling devices. The metal fins 250 preferably have a low height and are integrally formed with the top and bottom covers 210, 220 so as to minimize the size of the evaporator 20.

In the present heat exchange device 10, the condenser 40 has both a high heat-dissipation surface area due to the cooling fins 47 and a high heat-absorbing surface area due to the heat-exchange pins 45, the vapor entering into the condenser 40 is thus capable of being effectively heat-exchanged in the condenser 40. The condensate resulting from the vapor after releasing its latent heat in the condenser 40 is sent to the evaporator 20 for being available again for evaporation under the capillary forces developed by the first and second wick structures 501, 48 arranged respectively in the liquid conduit 50 and the condenser 40. With respect to the evaporator 20, the two-section design of the bottom cover 220 and the presence of the metal fins 250 on both the top and bottom covers 210, 220 cooperatively maintain a low temperature for the micro-channel region 231 of the evaporator 20 and effectively reduce the amount of vapor to be formed and accumulated in that region, thus enabling the condensate returned to the evaporator 20 to be supplied from the micro-channel region 231 to the evaporating region 232 of the evaporator 20 timely and eliminating the potential dry-out problem occurring at the evaporating region 232. As a result, the working fluid contained in the evaporator 20, when continuously undergoing phase transitions from liquid to vapor and then from vapor to liquid (condensate), effectively takes heat away from the heat source.

Figure 8:
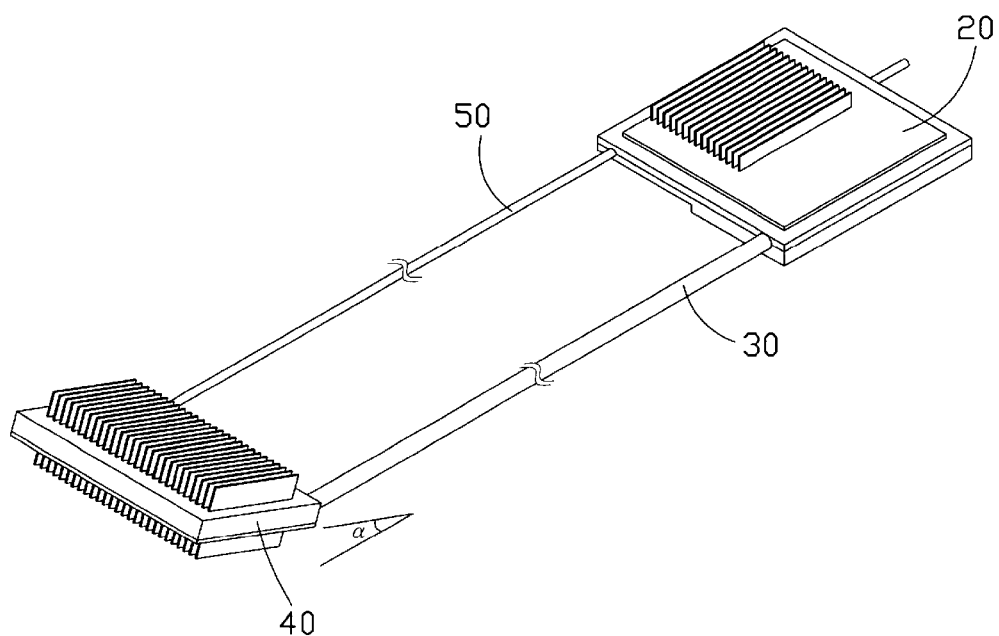
FIG. 8 is an isometric view of a loop-type heat exchange device in accordance with a second embodiment of the present invention.

FIG. 8 shows a loop-type heat exchange device (not labeled) in accordance with a second embodiment of the present invention. In this embodiment, the condenser 40 is disposed aslant with respect to the liquid conduit 50 and the vapor conduit 30, with an acute angle (a) formed therebetween. Thus, the condensate is capable of entering from the condenser 40 into the liquid conduit 50 more easily due to an additional driving force, i.e., the gravity of the condensate. In this embodiment, the condenser 40 is located at a position higher than that of the evaporator 20.

Figure 9:
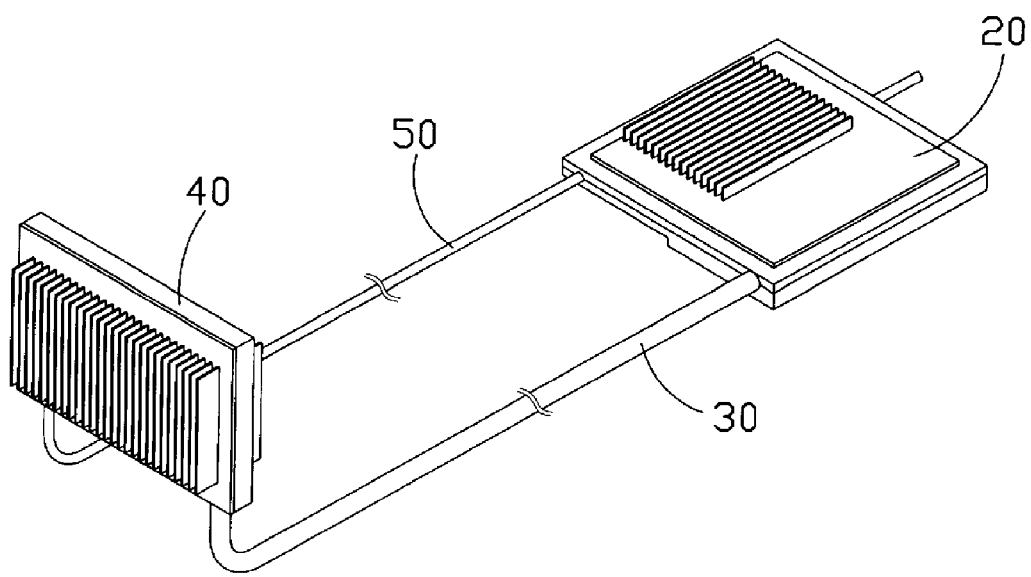
FIG. 9 is an isometric view of a loop-type heat exchange device in accordance with a third embodiment of the present invention.

FIG. 9 shows a loop-type heat exchange device (not labeled) in accordance with a third embodiment of the present invention. In this embodiment, the condenser 40 is disposed perpendicularly to the liquid conduit 50 and the vapor conduit 30. This heat exchange device is suitable for use in a desktop computer or the like and the heat removal capacity of the condenser 40 can be further improved by employing the forced airflow coming from the system cooling fan installed on the desktop computer. In this embodiment, the condenser 40 is located at a position higher than that of the evaporator 20.

Figure 10:
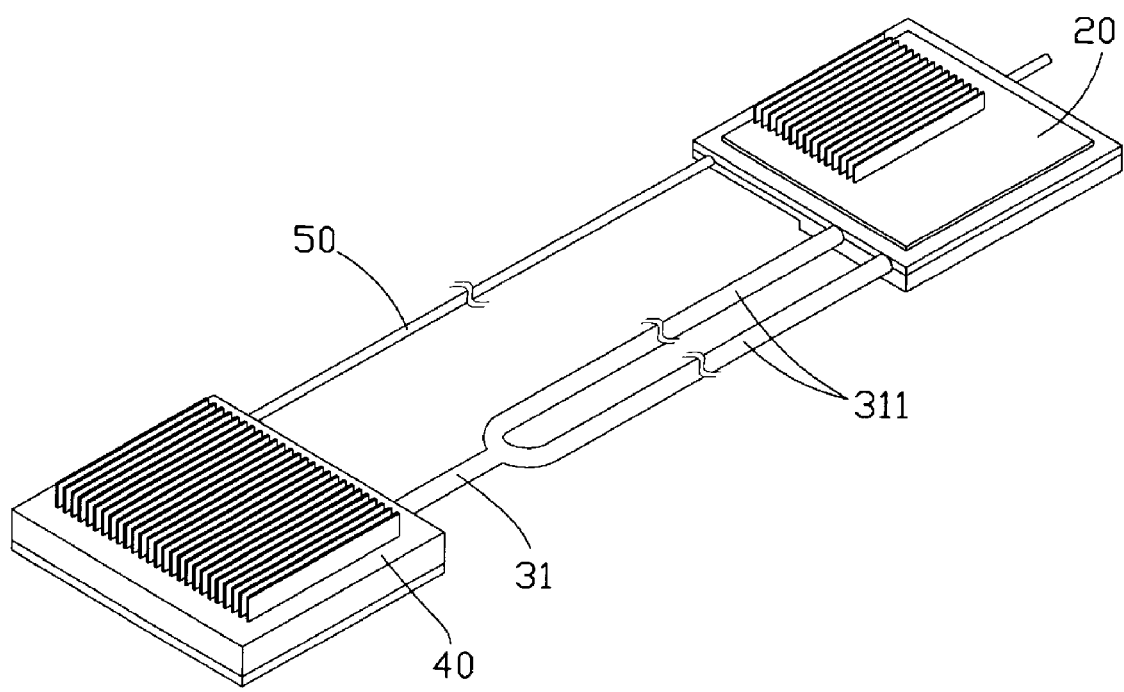
FIG. 10 is an isometric view of a loop-type heat exchange device in accordance with a fourth embodiment of the present invention.

FIG. 10 shows a loop-type heat exchange device (not labeled) in accordance with a fourth embodiment of the present invention. This heat exchange device includes a bifurcated vapor conduit 31, which is bifurcated at a location near the condenser 40 into two parallel pipes 311 connecting to the evaporator 20. With such vapor conduit 31, the vapor generated in the evaporator 40 faces a lower resistance as it marches from the evaporator 20 towards the condenser 40. Understandably, more than one vapor conduit may be simultaneously used in order to attain this purpose, i.e., reducing resistance to the flow of the vapor.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat exchange device comprising:
    an evaporator containing therein a working fluid, the working fluid being capable of turning into vapor in the evaporator upon receiving heat;
    a condenser defining therein a chamber;
    a vapor conduit and a liquid conduit each being connected between the evaporator and the condenser, wherein the vapor conduit is separated from the liquid conduit, the evaporator, the condenser, the vapor conduit and the liquid conduit cooperate to form a closed loop, the vapor is capable of being transferred via the vapor conduit to the condenser and turning into condensate in the condenser upon releasing the heat carried by the vapor, and the condensate is capable of being transferred via the liquid conduit to the evaporator;
    wherein a plurality of pins extend from an internal surface of the chamber of the condenser and are received in the chamber, a distal end portion of the vapor conduit extends into the chamber of the condenser and is disposed adjacent to the pins, a plurality of opening are defined in the distal end portion of the vapor conduit and face towards the pins; and
    wherein the evaporator defines therein a chamber, the chamber of the evaporator includes a liquid micro-channel region and an adjacent evaporating region, and a third wick structure is arranged inside the evaporator, the third wick structure spans across the two regions.

2. The heat exchange device of claim 1, wherein the pins includes a plurality of metal pin-fins.

3. The heat exchange device of claim 1, wherein a plurality of cooling fins extends from an outer surface of the condenser.

4. The heat exchange device of claim 1, wherein a first wick structure is arranged inside the liquid conduit.

5. The heat exchange device of claim 4, wherein a second wick structure is arranged inside the condenser and is connected with first wick structure arranged inside the liquid conduit, the second wick lines a sidewall of the condenser and connects the vapor conduit with the liquid conduit.

6. The heat exchange device of claim 1, wherein the distal end portion of the vapor conduit extends into the chamber of the condenser substantially from a middle of the condenser for being disposed between the pins, and the openings are distributed over a circumferential periphery of said distal end portion.

7. The heat exchange device of claim 1, wherein the distal end portion of the vapor conduit extends into the chamber of the condenser from one side of the condenser, and the openings are distributed over a portion of a circumferential periphery of said distal end portion and facing an opposite side of the condenser.

8. The heat exchange device of claim 1, wherein the condenser and the vapor conduit have and angle formed therebetween.

9. The heat exchange device of claim 1, wherein the micro-channel region of the chamber of the evaporator is fully filled with the third wick structure for receiving the condensate coming from the condenser, and the evaporating region is partially filled with the third wick structure for evaporation of the working fluid inside the evaporator.

10. The heat exchange device of claim 9, wherein the evaporator has a plurality of metal fins extending from an outer surface thereof corresponding to the micro-channel region of the chamber of the evaporator.

11. The heat exchange device of claim 9, wherein the evaporator includes a top cover and a bottom cover combined together to define the chamber of the evaporator, and the bottom cover has a first section and a second section, the second section is thicker than the first section of the bottom cover, the first section corresponds to the micro-channel region of the chamber of the evaporator, said second section corresponds to the evaporating region of the chamber of the evaporator.

12. The heat exchange device of claim 11, wherein a protrusion is formed outwardly from a portion of the second section of the bottom cover for contacting a heat source, and a portion of the third wick structure extends from the micro-channel region into a part of the evaporating region as fittingly locating above the protrusion of the bottom cover, the portion of the third wick has a size substantially equal to that of the protrusion of the bottom cover.

13. The heat exchange device of claim 1, wherein the vapor conduit has a larger diameter than the liquid conduit.

14. The heat exchange device of claim 1, wherein the vapor conduit diverges into multiple branches connecting with the evaporator.

15. A heat exchange device comprising:
an evaporator containing therein a working fluid, the working fluid being capable of turning into vapor in the evaporator upon receiving heat;
a condenser defining therein a chamber and having a plurality of heat-exchange pins extending into the chamber;
a vapor conduit and a liquid conduit each being connected between the evaporator and the condenser; and
first and second wick structures arranged inside the liquid conduit and the condenser, respectively; wherein
the vapor conduit is separated from the liquid conduit, the evaporator, the condenser, the vapor conduit and the liquid conduit cooperate to form a closed loop, the second wick structure is arranged on a side of the condenser to which the vapor conduit and the liquid conduit are connected, the vapor is capable of being transferred via the vapor conduit to the condenser and turning into condensate in the condenser upon releasing the heat, and the condensate is capable of being transferred via the liquid conduit to the evaporator under capillary forces developed by the first and section wick structures; and
wherein the evaporator defines therein a chamber, the chamber of the evaporator includes a liquid micro-channel region and an adjacent evaporating region, and a third wick structure is arranged inside and spans across the two regions, the micro-channel region of the chamber of the evaporator is fully filled with the third wick structure, and the evaporating region is partially filled with the third wick structure, and wherein a bottom portion of the evaporator has a first section and a second section, the second section is thicker than the first section of the bottom cover, the first section of the bottom portion corresponds to the micro-channel region of the chamber of the evaporator, the second section of the bottom portion corresponds to the evaporating region of the chamber of the evaporator.

16. The heat exchange device of claim 15, wherein said heat-exchange pins are metal fins.

17. The heat exchange device of claim 15, wherein a vapor distributor is formed at an end of the vapor conduit extending in the condenser.

18. The heat exchange device of claim 15, wherein the condenser is located at a position, which is higher than that of the evaporator.

19. The heat exchange device of claim 18, wherein the condenser is oriented inclinedly relative to the liquid conduit.

20. The heat exchange device of claim 18, wherein the condenser is oriented perpendicularly relative to the liquid conduit.

21. The heat exchange device of claim 15, wherein the vapor conduit is a bifurcated pipe with a multiple of ports connecting with the evaporator.

22. The heat exchange device of claim 15, wherein the vapor and liquid conduits are made of flexible material.

* * * * *